(12) United States Patent
Han et al.

(10) Patent No.: US 6,924,234 B2
(45) Date of Patent: Aug. 2, 2005

(54) METHOD AND APPARATUS FOR POLISHING A COPPER LAYER AND METHOD FOR FORMING A WIRING STRUCTURE USING COPPER

(75) Inventors: Ja-Hyung Han, Suwon-si (KR); Sang-Rok Hah, Seoul (KR); Hong-Seong Son, Suwon-si (KR); Duk-Ho Hong, Goyang-si (KR); Byung-Lyul Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 79 days.

(21) Appl. No.: 10/233,805

(22) Filed: Sep. 3, 2002

(65) Prior Publication Data

US 2003/0064587 A1 Apr. 3, 2003

(30) Foreign Application Priority Data

Sep. 21, 2001 (KR) ........................................ 2001-58749

(51) Int. Cl.[7] ........................ H01L 21/44; H01L 21/302
(52) U.S. Cl. ........................................ 438/687; 438/689
(58) Field of Search ................................ 438/584, 660, 438/687, 689, 706, 707, 710, 722, 745

(56) References Cited

U.S. PATENT DOCUMENTS

| 6,121,141 A | 9/2000 | Woo et al. ................... 438/687 |
| 6,150,269 A | * 11/2000 | Roy ............................. 438/687 |
| 6,254,758 B1 | * 7/2001 | Koyama ....................... 205/187 |
| 6,346,489 B1 | * 2/2002 | Cohen et al. ................ 438/789 |
| 6,423,200 B1 | * 7/2002 | Hymes ......................... 205/123 |
| 6,423,637 B2 | * 7/2002 | Kim ............................. 438/687 |
| 6,432,825 B1 | 8/2002 | Torii ........................... 438/692 |
| 6,444,567 B1 | * 9/2002 | Besser et al. ............... 438/625 |
| 6,616,510 B2 | * 9/2003 | Hsu et al. ...................... 451/41 |
| 6,689,689 B1 | * 2/2004 | Besser et al. ............... 438/687 |
| 6,709,970 B1 | * 3/2004 | Park et al. ................... 438/620 |

FOREIGN PATENT DOCUMENTS

| JP | 2000-173959 | 6/2000 | ......... H01L/21/302 |
| KR | 98-071288 | 10/1998 | ........... H01L/21/36 |
| KR | 1020020002084 | 1/2002 | ........... H01L/21/28 |
| KR | 1020020053534 | 7/2002 | ........... H01L/21/28 |
| KR | 1020020053609 | 7/2002 | ........... H01L/21/28 |

\* cited by examiner

*Primary Examiner*—David Zarneke
*Assistant Examiner*—Scott B. Geyer
(74) *Attorney, Agent, or Firm*—Mills & Onello LLP

(57) ABSTRACT

In a method and apparatus for polishing a Cu metal layer and a method for forming Cu metal wiring, Cu oxide created by a surface oxidation of a Cu metal layer is removed from the wafer. The Cu metal layer, in which Cu oxide is removed, is polished. By polishing the Cu metal layer using the above method, process failures, such as scratches, caused by the presence of remnants of Cu oxide during subsequent polishing can be prevented.

21 Claims, 8 Drawing Sheets

METHOD AND APPARATUS FOR POLISHING A COPPER LAYER AND METHOD FOR FORMING A WIRING STRUCTURE USING COPPER

BACKGROUND OF THE INVENTION

1. Field of the Invention

The present invention relates to a method and apparatus for polishing a copper (Cu) layer and a method for forming a wiring structure using Cu, and more particularly to a method for polishing a Cu layer formed by an electro-plating and annealing process, a polishing apparatus that is suitable for performing the polishing method, and a method for forming a wiring structure using Cu.

2. Description of the Related Art

As information media, such as computers, continue to become more widely used, associated semiconductor technology must continue to advance. Functionally, semiconductor devices must operate at high speeds with ever-increasing storage capacity. Accordingly, semiconductor technology has evolved to continually improve the degree of integration, reliability and performance of semiconductor devices. For this reason, there are strict requirements for electric wiring techniques.

In a conventional electric wiring structure, aluminum is primarily used due to its lower contact resistance and relatively simple fabrication process. However, as semiconductor devices become more highly integrated, the aluminum wiring structure exhibits limitations such as a junction spike failure and electromigration. In addition, in order to improve the response speed of the semiconductor device, materials having a contact resistance lower than that of aluminum are needed.

Recently, a Cu wiring having a low resistance and superior electromigration characteristics have become widely used. However, Cu is rapidly diffused into silicon or other metal layers during processing. Thus, a conventional photolithography process is not suitable for Cu wiring. For this reason, a damascene process is generally used for forming Cu wiring. According to the conventional damascene process, a film is formed in order to bury a trench, and then a polishing process is carried out such that the film remains only in the trench, thereby forming a pattern. Therefore, the polishing process for the Cu metal layer is critical to the formation of Cu wiring in the damascene process. Accordingly, suitable process conditions and components (such as, a slurry, a polishing pad, and the like) are required for polishing the Cu metal layer.

FIGS. 1A and 1B are sectional views showing a conventional method for forming a Cu metal wiring.

Referring to FIG. 1A, an insulation layer 12 is formed on a silicon wafer 10. A trench 14 is formed at a predetermined portion on the insulation layer 12. The trench 14 eventually will become a passage for forming the Cu wiring. Then, a Cu metal layer 16 is formed to fill and bury the trench 14, for example through an electro-plating technique, and then the Cu is crystallized by a thermal heat treatment process. A method for removing voids from the Cu metal layer 16 by annealing the Cu metal layer 16 is disclosed in U.S. Pat. No. 6,121,141.

When annealing the Cu metal layer 16, a Cu oxide layer 18, such as CuO, or $CuO_2$, is formed on a surface of the Cu metal layer 16 as a result of the reaction between Cu and oxygen. The resulting thickness of the Cu oxide layer 18 varies depending on the temperature and time of the annealing process. Generally, the Cu oxide layer 18 has a non-uniform thickness from 0 to several hundred angstroms (Å).

Referring to FIG. 1B, a Cu metal wiring 16a is formed by polishing an upper surface of the Cu metal layer 16 such that Cu remains only in the trench 14.

When performing the polishing process, the surface of the Cu metal layer 16 to be polished can be scratched, and the polishing uniformity can be lowered. That is, residue from the Cu oxide layer 18 formed on the surface of the Cu metal layer 16 and having a non-uniform thickness can operate as particles during polishing, such that scratches are created on the surface of the Cu metal layer 16. In addition, the polishing rate at each part of the silicon wafer varies depending on the corresponding thickness of the Cu oxide layer 18, so that the polishing uniformity is adversely affected.

Korean Patent Application No. 98-004144 (Korean Patent Laid-Open Publication No. 1998-071288) discloses a process for forming a Cu wiring. In this example, the Cu layer that is to be removed for forming the wiring is selectively oxidized by surface oxidation of the Cu layer. Then, the Cu oxide layer formed by the oxidation of the Cu layer is removed through the polishing or etching process, thereby forming the Cu wiring. However, it is very difficult to optimize the process condition such that the oxidation can be performed to an upper portion of the wiring, that is, to the very upper portion of the trench. If the Cu layer is not oxidized to the precise position, it is impossible to form the wiring through the etching or polishing process.

SUMMARY OF THE INVENTION

The present invention addresses the limitations of the conventional approaches. In this manner, a polishing system and method are provided for forming Cu wiring having improved planarization, while mitigating scratches during fabrication, and improving yield.

It is a first object of the present invention to provide a method for polishing a Cu metal layer capable of reducing process failure.

It is a second object of the present invention to provide an apparatus for polishing a Cu metal layer adapted for reducing process failure.

It is a third object of the present invention is to provide a method for forming a Cu metal wiring structure capable of reducing process failure.

To achieve the first object of the present invention, there is provided a polishing method comprising the steps of removing Cu oxide from a wafer, created by surface oxidation of a Cu metal layer, wherein the Cu metal layer is formed as an uppermost layer on the wafer; and polishing the Cu metal layer, from which the Cu oxide has been removed.

To achieve the second object of the present invention, there is provided a wafer polishing apparatus comprising: a polishing head for securing and positioning a wafer to be polished; a platen positioned opposite the polishing head and having a polishing pad on an upper surface thereof; a slurry supplying section for supplying a slurry to the polishing pad; and a first cleaning section for removing Cu oxide that forms on a surface of the wafer by providing a chemical onto the wafer, the first cleaning section operating on the wafer prior to polishing of the wafer by the polishing head.

To achieve the third object of the present invention, there is provided a method for forming Cu wiring in a semiconductor device, the method comprising the steps of: forming a trench on a predetermined portion of an insulation layer; forming a barrier metal layer at a sidewall and a lower side of the trench and the insulation layer; forming a Cu metal layer such that the trench having the barrier metal layer is buried by the Cu metal layer; annealing the Cu metal layer thereby crystallizing the Cu metal layer; removing Cu oxide that forms as a result of surface oxidation of the Cu metal when the Cu metal layer is crystallized; and vi) polishing the Cu metal layer such that an upper surface of the insulation layer is exposed, thereby forming the Cu wiring.

In the apparatus and system of the present invention, the Cu oxide layer is removed prior to polishing, such that scratches or other failure-inducing features that would otherwise be caused by the presence of the Cu oxide layer can be mitigated or prevented.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF PREFERRED EMBODIMENTS

Figure 1A:
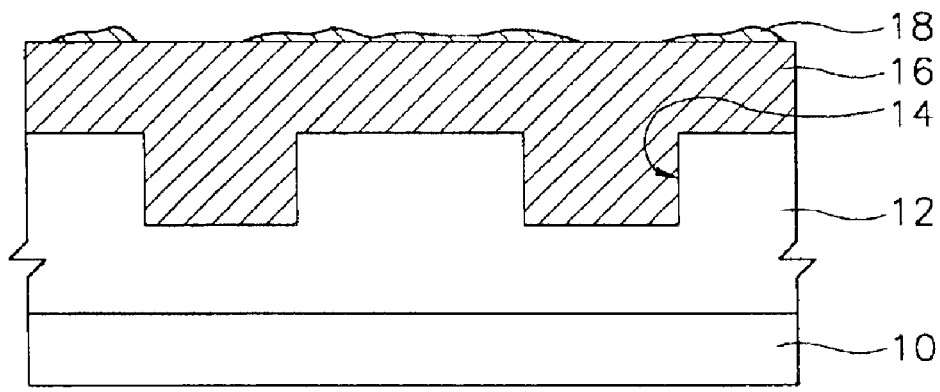
FIGS. 1A and 1B are sectional views showing a conventional method for forming Cu metal wiring.
Figure 1B:
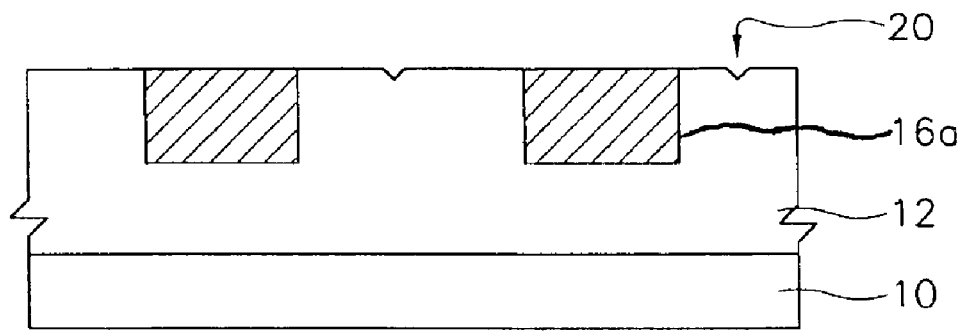

Hereinafter, a method for polishing a Cu metal layer according to one embodiment of the present invention will be described.

Initially, a silicon wafer having a Cu metal layer as an uppermost layer thereof is prepared. In order to form the Cu metal layer, a relatively thin Cu seed layer is formed, which is, in effect, a pre-treatment process for forming the Cu metal layer. The Cu seed layer is used as an electrode during a subsequent Cu plating process. Then, Cu is plated on the Cu seed layer through an electroplating process, thereby forming the Cu metal layer. By performing the electroplating process, pure Cu metal is extracted on a surface of a cathode by an electrolysis action. The Cu metal formed by the electroplating process has a metastable state, in which crystal grains are non-uniformly arranged. For this reason, the Cu metal layer is annealed (heat-treated) for crystallizing the Cu metal layer. The annealing (or heat-treating) process is carried out, for example, at a temperature of about 200 to 300° C.

However, during this process, a Cu oxide layer is non-uniformly formed at the surface of the Cu metal layer that is caused by a reaction between the Cu and oxygen. The Cu oxide layer can, for example, be naturally formed when Cu is in contact with air at room temperature. When the annealing process is carried out, Cu is actively reacted with oxygen, so the Cu oxide layer is primarily formed during the annealing process. The thickness and quantity of the Cu oxide layer varies depending on the temperature and duration of the annealing process. Generally, the Cu oxide layer has an non-uniform thickness of about 0 to several hundred Å.

Next, the Cu oxide formed on the surface of the Cu metal layer is removed. In order to remove Cu oxide, a wet cleaning process or a dry etching process using plasma is carried out.

The Cu oxide can be removed under a wet cleaning process. Firstly, a chemical for etching Cu oxide is supplied to the surface of the wafer including Cu oxide. The chemical includes, for example, a hydrogen fluoride (HF) aqueous solution or hydrogen chloride (HCl) aqueous solution. After removing Cu oxide by using the chemical, deionized water is supplied onto the wafer for removing any chemicals that remain on the wafer. For supplying the chemical or deionized wafer to the surface of the wafer, the chemical or deionized water can be uniformly sprayed onto the surface of the wafer at a predetermined pressure, or the wafer can be directly dipped into a bath of the chemical or deionized water. Thereafter, the wafer is subjected to a drying process.

The Cu oxide layer can alternatively be removed by performing a dry etching process using RF plasma. In addition, a remote plasma type dry etching process using excited etching gas can be carried out for removing the Cu oxide layer.

After removing the Cu oxide layer, the Cu metal layer that is an uppermost layer of the wafer is polished. As described above, by removing the Cu oxide layer formed on the surface of the Cu metal layer prior to polishing the Cu metal layer, related process failures, such as scratches caused by the Cu oxide layer having an irregular thickness, can be mitigated or eliminated during subsequent polishing of the Cu metal layer.

Hereinafter, the present invention will be described in detail with reference to the accompanying drawings.

FIGS. 2A to 2G are sectional views showing a method for forming a Cu metal wiring according to one embodiment of the present invention.

Figure 2A:
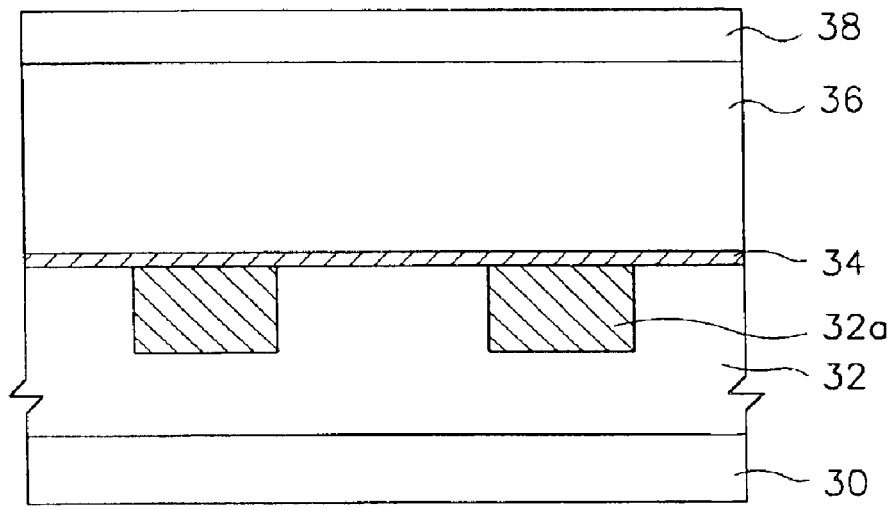
FIGS. 2A to 2G are sectional views showing a method for forming a Cu metal wiring according to an embodiment of the present invention.

Referring to FIG. 2A, a first insulation layer 32 having a hole or a trench filled with a conductive material is formed on a silicon wafer 30. Accordingly, an upper surface of a conductive pattern 32a formed by filling the conductive material is exposed at a predetermined portion of an upper surface of the first insulation layer 32.

An etch stop layer 34 is then formed on the first insulation layer 32. Sequentially, a second insulation layer 36 and a third insulation layer 38 are formed on the etch stop layer 34. Via holes for connecting the conductive pattern 32a to conductive lines to be formed at an upper portion of the conductive pattern 32a through a later process are formed in the second insulation layer 36. The second insulation layer 36 serves as an insulation buffer between adjacent via holes. A trench providing a passage for forming the conductive lines in a later process is also formed at the third insulation layer 38, which also serves as an insulation buffer between the conductive lines. Since a conductor/insulator/conductor structure is formed between adjacent conductive lines, parasitic capacitance increases between adjacent conductive lines. Accordingly, the third insulation layer 38 is formed of an insulation material having a relatively low dielectric constant. For example, the third insulation layer 38 may comprise an insulation material having a dielectric constant below 3.5.

Figure 2B:
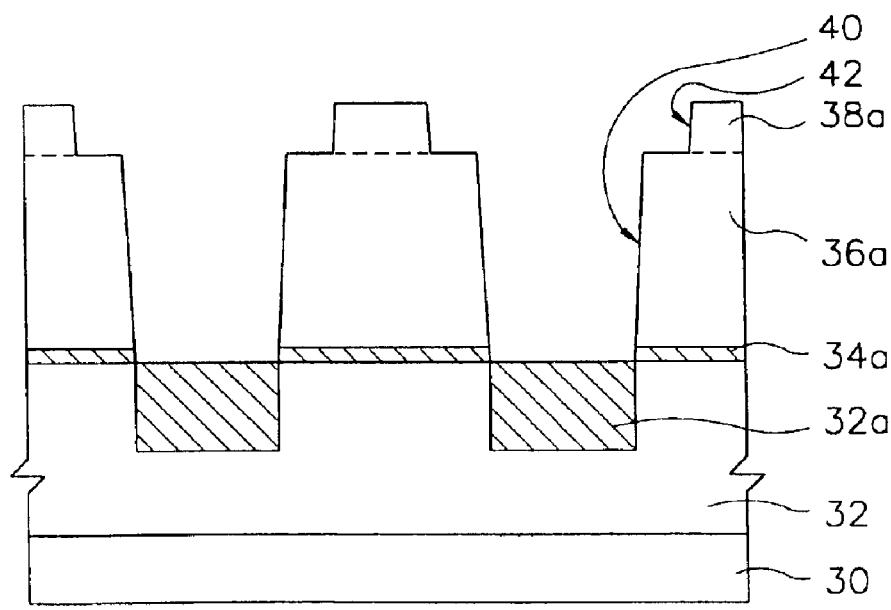

Referring to FIG. 2B, predetermined portions of the third insulation layer 38 and the second insulation layer 36 are anisotropically etched such that the etch stop layer 34 formed on the conductive pattern 32a of the first insulation layer 32 is exposed, thereby forming via holes 40. In addition, a predetermined portion of the third insulation layer 38 is further etched to form linear trenches 42 above, and including, the via holes 40. The portion of the etch stop layer 34 is exposed at the bottom of the via holes 40 is then anisotropically etched, thereby exposing the underlying conductive pattern 32a. In this manner a dual damascene structure having via holes 40 and trenches 42 for forming a conductive line is formed.

Figure 2C:
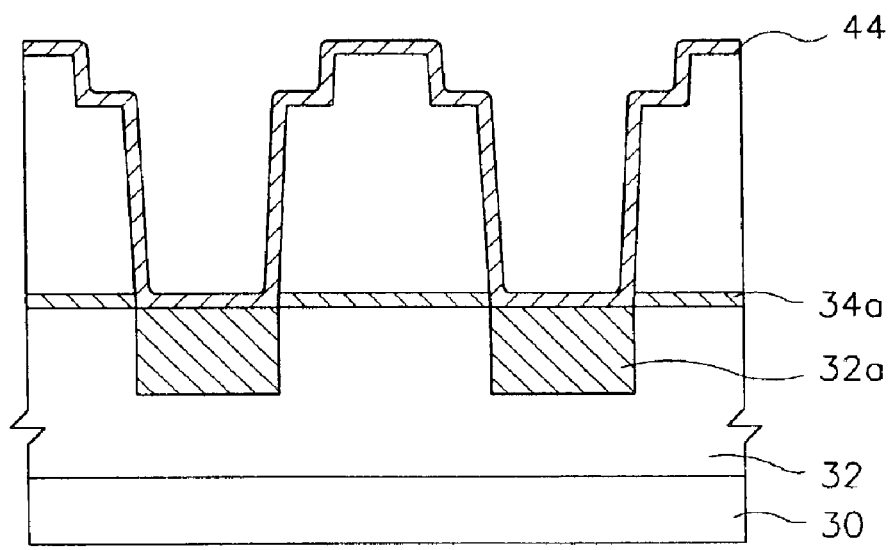

Referring to FIG. 2C, a barrier metal layer 44 is continuously formed to coat the sidewalls and bottoms of the via holes 40 and trenches 42 and an upper surface of the third insulation layer 38a. The barrier metal layer 44 prevents Cu atoms from diffusing into the second and third insulation layers during subsequent formation the Cu metal layer. The barrier metal layer comprises, for example, a tantalum layer, a tantalum nitride layer, and a composite layer including the tantalum layer on which the tantalum nitride layer is deposited.

Figure 2D:
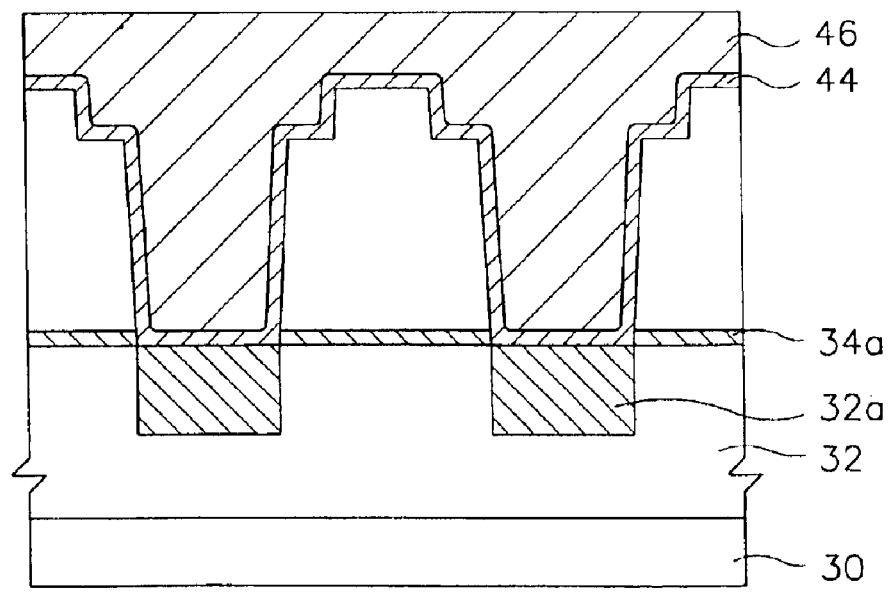

Referring to FIG. 2D, the Cu metal layer 46 is formed while burying the via holes 40 and trenches 42 including the barrier metal layer 44. In order to form the Cu metal layer 46, a relatively thin Cu seed layer is shallowly deposited on the barrier metal layer 44. The Cu seed layer operates as an electrode during subsequent formation of the Cu metal layer 46 using a plating technique. Cu is then is electroplated on the Cu seed layer such that the via holes and trenches are buried, thereby forming the Cu metal layer 46.

Figure 2E:
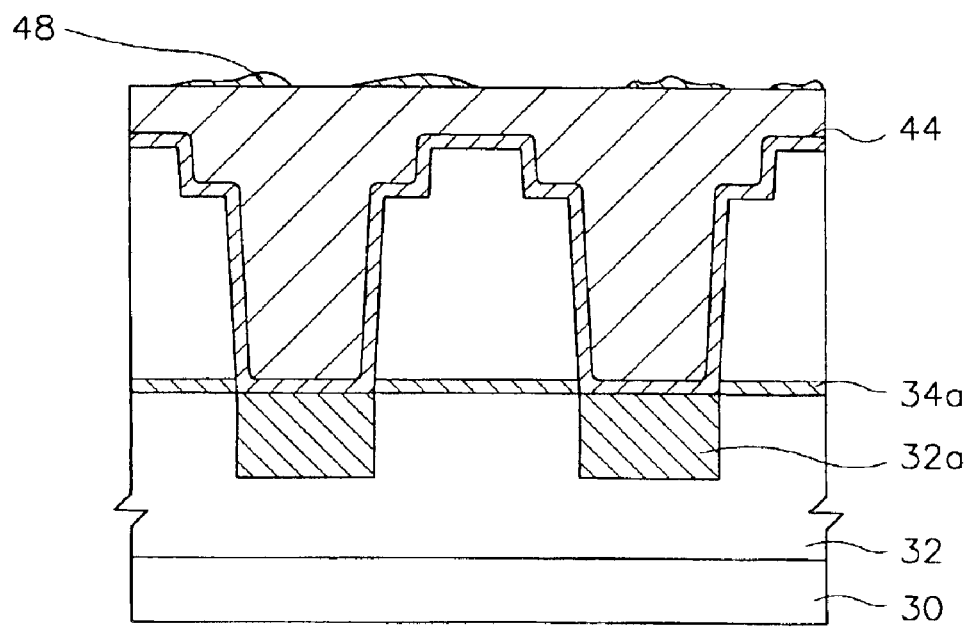

Referring to FIG. 2E, the Cu metal layer 46 is crystallized by performing an annealing (heat-treating) process at a temperature of, for example, about 200 to 300° C. That is, thermal energy is applied to the Cu atoms in the Cu metal layer 46, so that Cu atoms in a metastable state are densely arranged, and thus the crystallized Cu metal layer 46 is formed. When performing the annealing process, a Cu oxide layer 48 having a non-uniform thickness is formed on a surface of the Cu metal layer 46 due to the reaction between Cu and oxygen.

Figure 2F:
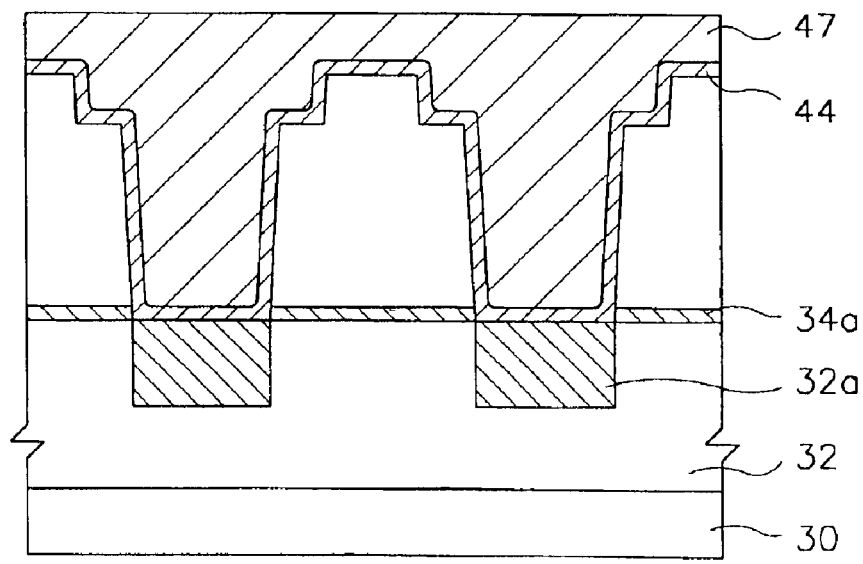

Referring to FIG. 2F, the Cu oxide layer 48 formed on the surface of the Cu metal layer 46 during the annealing process is removed. The Cu oxide layer 48 can be removed by performing a wet cleaning process using a chemical for etching the Cu oxide layer 48. As mentioned above, the chemical used for the wet cleaning process includes, for example, a hydrogen fluoride (HF) aqueous solution (HF: $H_2O$=about 1:100), or hydrogen chloride (HCl) aqueous solution. In addition, the Cu oxide layer 48 can alternatively be removed by performing a dry etching process using plasma, or a remote plasma type dry etching process using excited plasma.

Figure 2G:
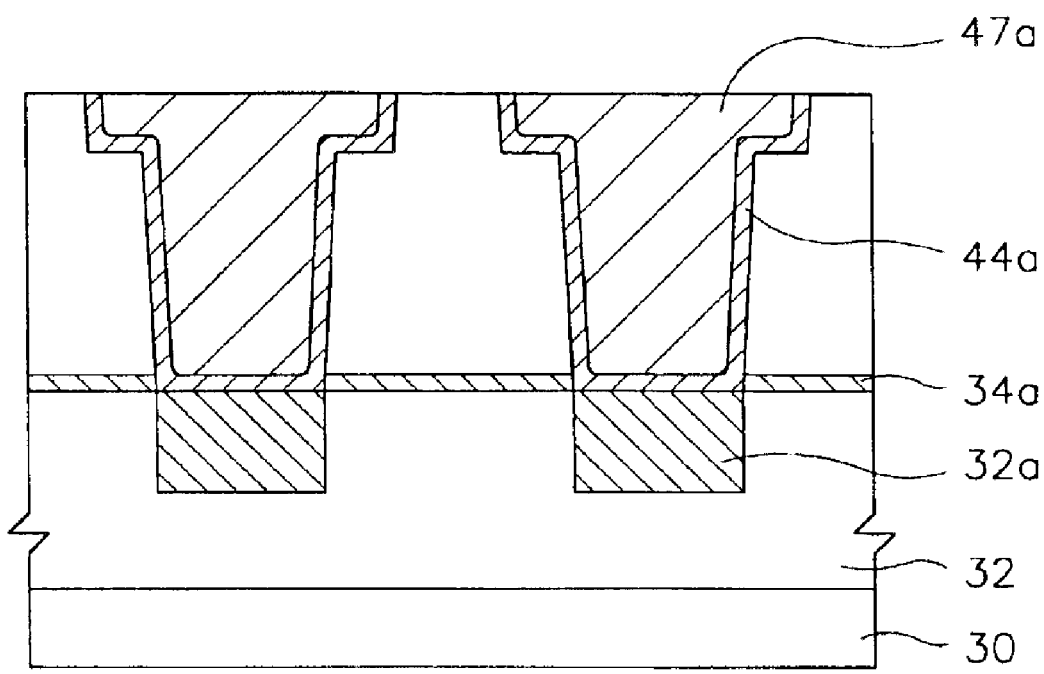

Referring to FIG. 2G, a Cu wiring structure 47 is formed so that Cu metal material is present only in trenches 42 and via holes 40 by polishing the Cu metal layer 46 and the barrier metal layer 44 to a depth such that the upper surface of the third insulation layer 38a is exposed.

Since the Cu metal layer 46 is polished following removal of the non-uniform Cu oxide layer from the surface of the Cu metal layer 46, process failures, such as scratches caused by the Cu oxide layer becoming separated from the surface of the Cu metal layer, can be mitigated or prevented when performing the polishing process.

The dual damascene structure, in which contacts and conductive lines are simultaneously formed, can be achieved in the above-disclosed Cu wiring process. Though the polishing process is described with reference to the dual damascene structure achieved through the above-mentioned Cu wiring forming process, the polishing process the present invention that incorporates pre-treatment for removing the Cu oxide layer can be adapted for various structures achieved by the damascene process. For example, the above-mentioned polishing process can be carried out subsequent to filling a Cu metal layer in via holes, or subsequent to filling a Cu metal layer in trenches providing the passage for forming the Cu wiring.

Figure 3:
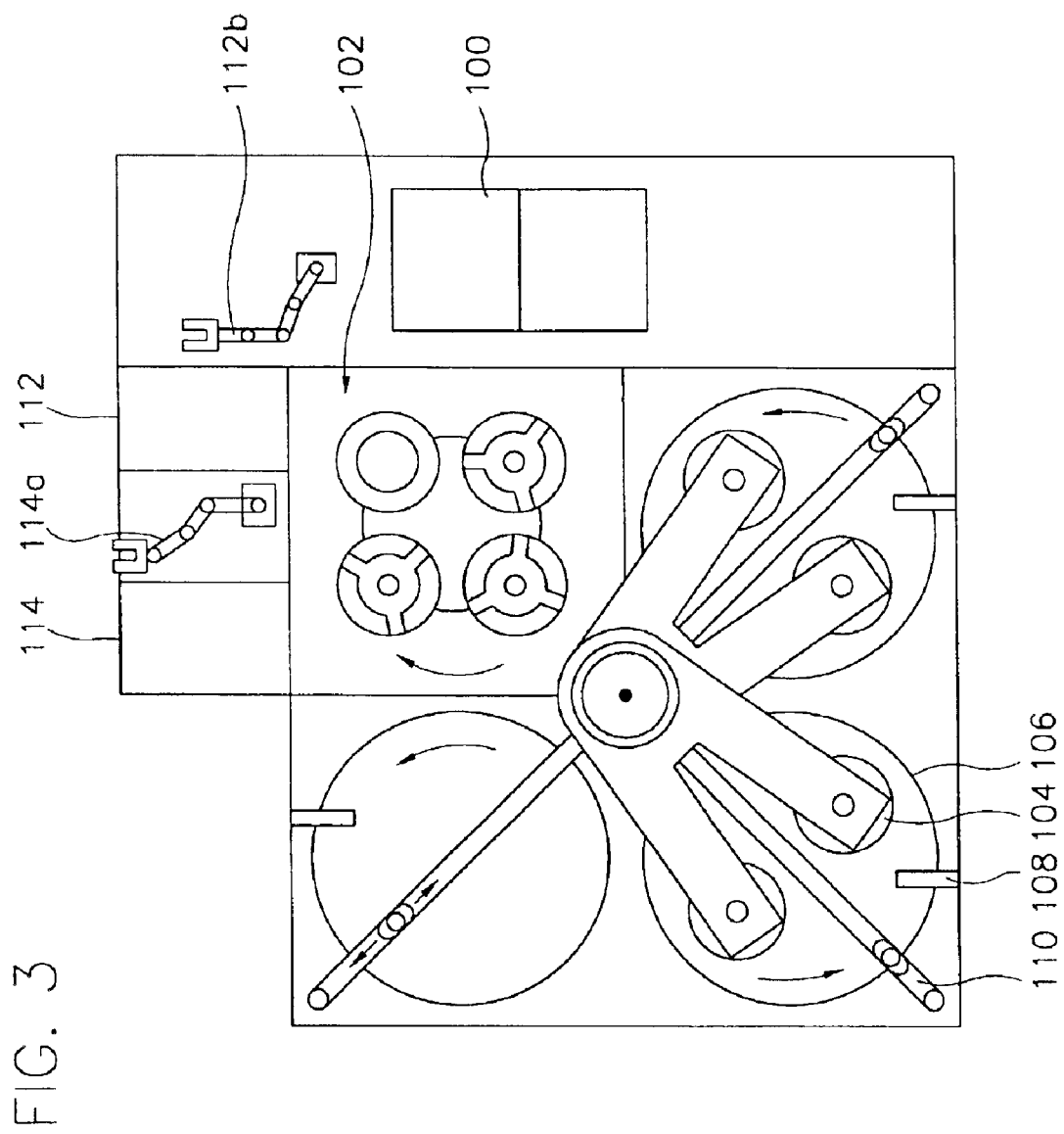
FIG. 3 is a schematic view showing a structure of a polishing apparatus adapted for carrying out the polishing process according to an embodiment of the present invention.

FIG. 3 is a schematic view illustrating a polishing apparatus adapted for carrying out the polishing process described above, according to an embodiment of the present invention. Referring to FIG. 3, the polishing apparatus includes a stand-by section 100 on which wafer lots to be polished are placed. In addition, a wafer loading section 102 is provided for receiving the wafer prior to or subsequent to the polishing process. The wafer is temporarily placed on the wafer loading section 102 before the wafer is gripped (for example by vacuum) by the polishing heads or after the wafer is released from the polishing heads. As shown in FIG. 3, the loading section 102 can receive plural lots of wafers and rotates horizontally toward the polishing heads for placing the wafers thereon and allowing the wafers to be easily transferred to the polishing heads. The polishing heads 104 are spaced apart from the wafer loading section 102. The polishing heads 104 grip (hold the wafer for example by vacuum) and press the wafer to be polished. In addition, the polishing heads 104 can optionally be rotated.

Platens 106 are positioned opposite the wafer secured by the polishing heads 104. The platens 106 have a polishing pad at an upper surface thereof, and are driven to rotate. The illustrated polishing apparatus has three platens 106 and four polishing heads 104, and therefore can simultaneously polish four wafers.

A slurry supplying section 108 is provided to supply a slurry onto the polishing pad. The slurry is abrasive chemically and physically so as to react with the layers formed on the wafer. In addition, a polishing pad conditioner 110 is provided for conditioning the polishing pad.

A first cleaning section 112 is positioned so as to be spaced apart from the platens 106 and operates to remove the Cu oxide layer formed on the surface of the wafer by providing the chemical onto the wafer before the wafer is polished. The first cleaning section 112 pulls a wafer out of the wafer lot placed in the stand-by section 100 and cleans the wafer prior to polishing. The cleaned wafer is then transferred to the wafer loading section so as to be polished.

Figure 4:
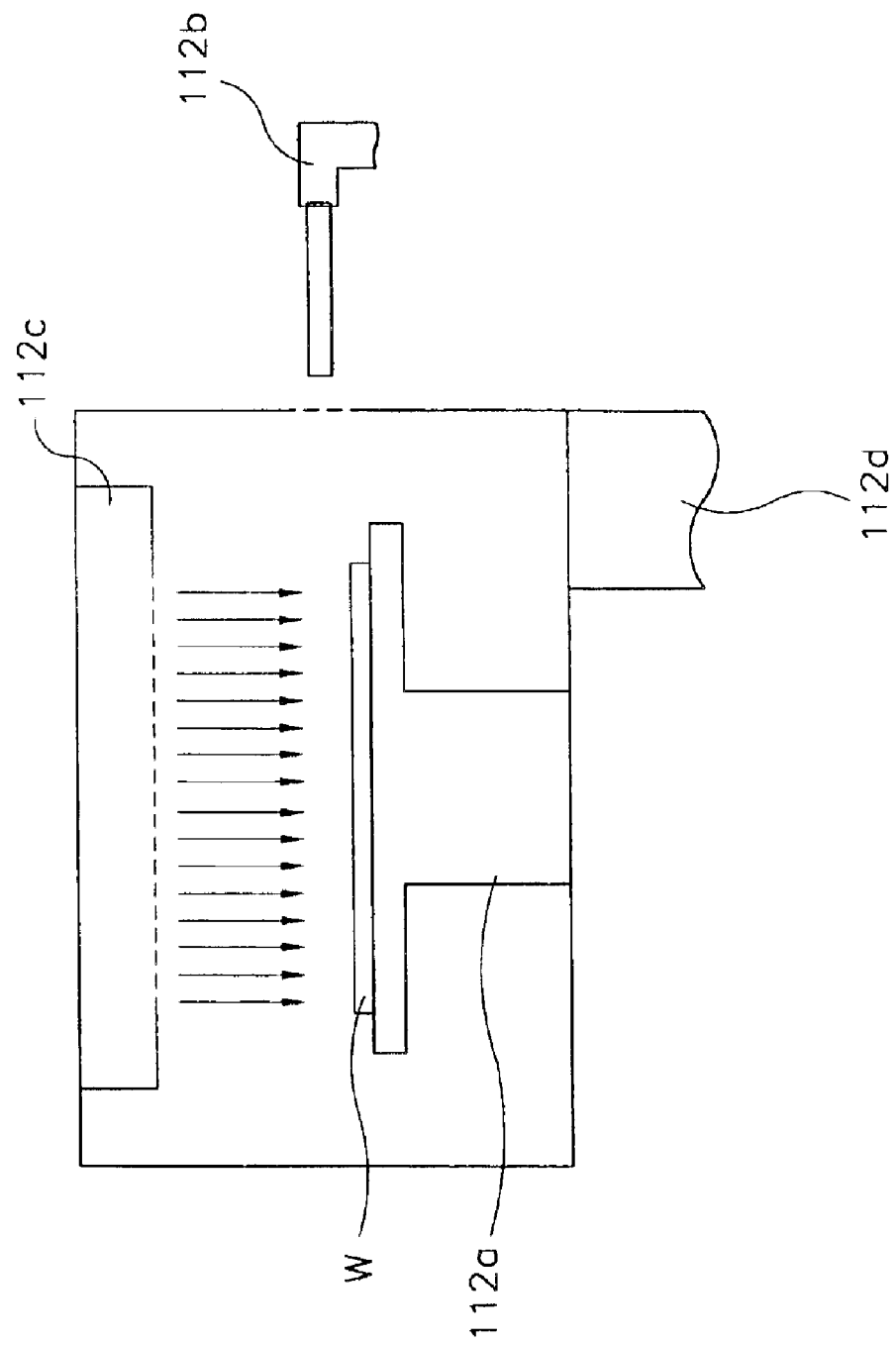
FIGS. 4 and 5 are views showing a first cleaning section of the polishing apparatus of FIG. 3.

Hereinafter, the first cleaning section 112 will be described in detail with reference to FIG. 4. The cleaning section 112 includes a chuck 112a for placing the wafer W to be cleaned thereon. The wafer W is fixedly placed on the chuck 112a. In addition, a first transferring part 112b is provided for transferring the wafer W awaiting the polishing process to the chuck 112a. A chemical supplying part 112c is provided for spraying the cleaning chemical onto the surface of the wafer W placed on the chuck 112a. In addition, a draining part 112d is provided for collecting and discharging the cleaning chemical continuously sprayed onto the surface of the wafer W. The cleaning chemical is capable of etching the Cu oxide that forms on the surface of the wafer W, as described above. For example, a hydrogen fluoride (HF) aqueous solution can be used as the cleaning chemical. Accordingly, the first cleaning section 112 removes Cu oxide by spraying the cleaning chemical onto the surface of the wafer W.

Figure 5:
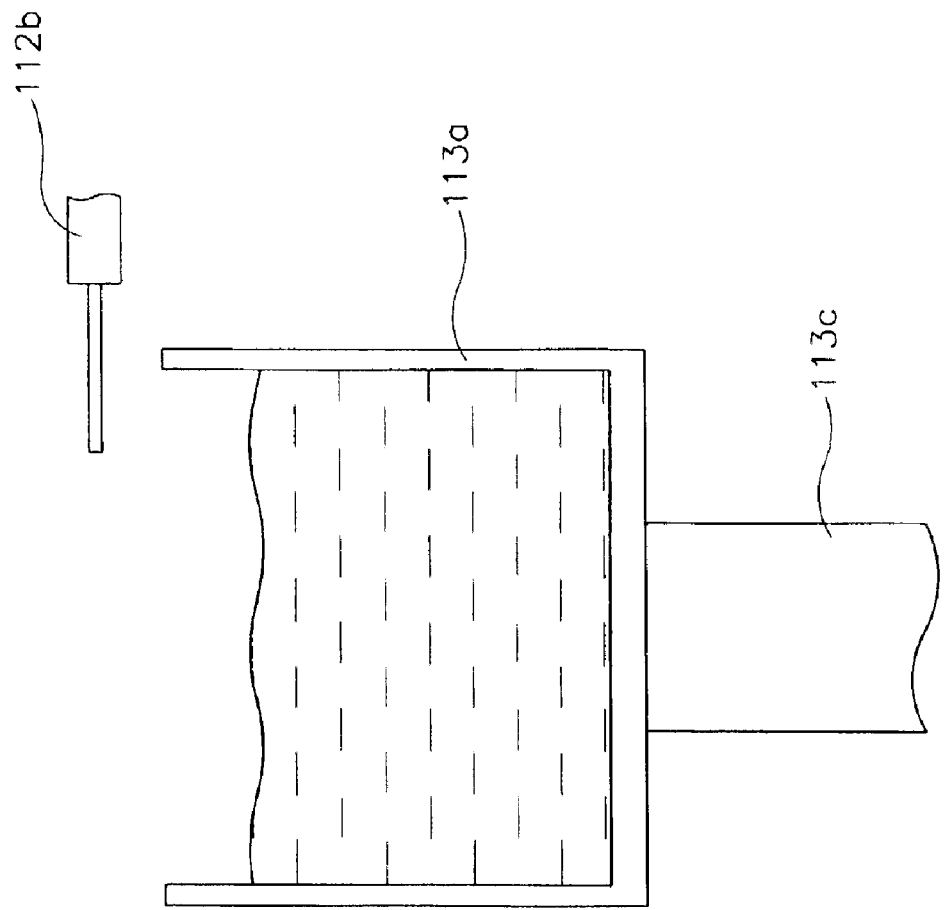

FIG. 5 is a schematic view of the first cleaning section 112 according to another embodiment of the present invention. Referring to FIG. 5, a chemical reservoir 113a is provided for receiving the chemical. The chemical for etching Cu oxide formed on the surface of the wafer is received in the chemical reservoir 113a. In addition, a first transferring part 112b is provided for transferring the wafer waited in the stand-by section 100 into the chemical reservoir 113a. A draining part 113c is provided to discharge the chemical from the chemical reservoir 113a. Accordingly, the first cleaning section 112 removes Cu oxide formed on the surface of the wafer by immersing the wafer in the chemical.

Returning to FIG. 3, a second cleaning section 114 is positioned adjacent to the first cleaning section 112 for removing the chemical remaining on the wafer after the cleaning process has been carried out by the first cleaning section 112. The second cleaning section 114 includes a transferring part 114a for transferring the cleaned wafer from the first cleaning section 112 to the next process stage. Deionized water is supplied onto the surface of the wafer, for example by spraying the deionized water onto the surface of the wafer, or submerged the wafer in the deionized water. The second cleaning section 114 has a structure similar to that of the first cleaning section 112, except that deionized water is used instead of the chemical, so the detailed description thereof will be omitted. When the polishing process is carried out using the above-mentioned polishing apparatus, particles or non-uniform films formed on the surface of the wafer are removed through the first and second cleaning sections before the polishing process is performed. In this manner, process failures, such as scratches, can be prevented or mitigated. In addition, since the cleaning process and the polishing process are carried out in the same polishing apparatus, the transferring route of the wafer can be shortened, so that the process time can be reduced. Furthermore, it is possible to perform the polishing process immediately following cleaning of the wafer, so a separate wafer drying process is not required after the cleaning process is complete.

Surface Roughness Test

After performing the process for forming the Cu metal wiring according to one embodiment of the present invention, the surface roughness of the wafer was measured. The obtained data are shown in table 1.

In detail, after plating the Cu metal layer on the wafer, the wafer was subject to the annealing process at a temperature of about 200° C. In addition, Cu oxide formed on the surface of the wafer was removed by using the cleaning chemical including HF and $H_2O$ in a ratio of 1:500. Then, the surface roughness of the wafer was analyzed by using an AFM (atomic force microscope). The AFM is a device for inspecting the surface roughness by detecting a height of a probe while maintaining a predetermined distance between a surface of a sample and the probe.

TABLE 1

|  | Rms | Ra | R (max − min) |
|---|---|---|---|
| After cleaning | 3.385 nm | 2.637 nm | 33.670 nm |

In table 1, Rms (room mean square) represents the square root of a mean of squaring values of a height of each probe. Ra represents a mean value of the height of each probe, and R (max-min) represents the difference between a maximum height of the probe and a minimum height of the probe.

Table 2 shows data obtained without performing the cleaning process for removing Cu oxide. In the same manner as in table 1, the Cu metal layer was plated on the wafer and the wafer was subject to the annealing process at a temperature of about 200° C.

TABLE 2

|  | Rms | Ra | R (max − min) |
|---|---|---|---|
| Before cleaning | 8.650 nm | 7.182 nm | 58.16 nm |

As shown in Tables 1 and 2, the surface roughness of the wafer was improved when the Cu oxide layer was removed by using the cleaning chemical. Accordingly, it can be noted that the Cu oxide layer non-uniformly formed on the surface of the wafer was actually removed by treating the surface of the wafer with the cleaning chemical.

Scratch Test

After forming the Cu metal wiring according to the method of the present invention, the number of scratches created during the polishing process was measured. The obtained data are shown in table 3.

In detail, after plating the Cu metal layer on the wafer, the wafer was subject to the annealing process at a temperature of about 200° C. In addition, Cu oxide formed on the surface of the wafer was removed by using the cleaning chemical including HF and $H_2O$ in a ratio of 1:500. Then, the polishing process was carried out with respect to the wafer in which Cu oxide has been removed. Thereafter, the number of scratches crated on the surface of the wafer was measured.

TABLE 3

|  | 1st metal layer | 1st metal layer | 6th metal layer |
|---|---|---|---|
| After cleaning | 571 | 873 | 6550 |

Table 3 shows the number of scratches created when forming the first metal layer and the sixth metal layer of a multi metal layer in a semiconductor manufacturing process.

Table 4 shows the number of scratches created during the polishing process without performing the cleaning process for removing Cu oxide. In the same manner as in Table 3, the Cu metal layer was plated on the wafer and the wafer was subject to the annealing process at a temperature of about 200° C.

TABLE 4

|  | 1st metal layer | 1st metal layer | 6th metal layer |
|---|---|---|---|
| Before cleaning | 1146 | 2392 | 7579 |

As shown in Tables 3 and 4, the number of scratches created on the surface of the wafer was reduced when the Cu oxide layer was removed by using the cleaning chemical. As can be noted from the above tables, the scratches created during the polishing process can be reduced by performing the cleaning process for removing the Cu oxide layer having the non-uniform thickness formed on the Cu metal layer.

As described above, according to the present invention, a Cu metal layer can be polished while reducing the occurrence of process faults, such as scratches, created during the polishing process. Therefore, the failure of the semiconductor device caused by the scratches can be prevented and the reliability and productivity of the semiconductor device can be improved.

While the present invention has been described in detail with reference to the preferred embodiment thereof, it should be understood to those skilled in the art that various changes, substitutions and alterations can be made hereto without departing from the scope of the invention as defined by the appended claims.

What is claimed is:

1. A wafer polishing method comprising the steps of:
   forming a Cu fill metal layer that fills a via hole of an underlying layer of a wafer;
   following forming the Cu fill metal layer, wet-cleaning using a cleaning chemical to remove Cu oxide from an upper surface of the Cu fill metal layer, the Cu oxide being created by surface oxidation of the Cu fill metal layer; and
   polishing the Cu fill metal layer, from which the Cu oxide has been removed.

2. The polishing method as claimed in claim 1, wherein wet cleaning using the cleaning chemical to remove the Cu oxide includes the sub-steps of providing the cleaning chemical onto a surface of the wafer including Cu oxide, and removing the cleaning chemical remaining on the upper surface of the Cu fill metal layer by providing deionized water onto the upper surface of the Cu fill metal layer that has been treated by the cleaning chemical.

3. The polishing method as claimed in claim 2, wherein the cleaning chemical is sprayed onto the wafer or the wafer is immersed in the cleaning chemical.

4. The polishing method as claimed in claim 1, wherein the cleaning chemical includes a hydrogen fluoride (HF) aqueous solution.

5. The method of claim 1 wherein the underlying layer comprises an insulation layer.

6. The method of claim 1 further comprising, prior to forming the Cu fill metal layer, forming a Cu seed layer that coats side walls and a bottom of the via hole.

7. The method of claim 6 wherein forming the Cu fill metal layer comprises electroplating the Cu fill metal layer using the Cu seed layer as an electrode.

8. The polishing method as claimed in claim 1, wherein the chemical includes a hydrogen chloride (HCl) aqueous solution.

9. The polishing method as claimed in claim 1 wherein polishing the Cu fill metal layer comprises polishing by chemical mechanical polishing (CMP).

10. A method for forming Cu wiring in a semiconductor device, the method comprising the steps of:
   i) forming a trench on a predetermined portion of an insulation layer;
   ii) forming a barrier metal layer at a sidewall and a lower surface of the trench and the insulation layer;
   iii) forming a Cu fill metal layer such that the trench having the barrier metal layer is buried by the Cu metal layer;
   iv) annealing the Cu fill metal layer, thereby crystallizing the Cu fill metal layer;
   v) following forming and annealing the Cu fill metal layer, removing Cu oxide that forms as a result of surface oxidation of the Cu fill metal layer when the Cu fill metal layer is crystallized, by wet-cleaning the Cu oxide using a cleaning chemical; and
   vi) following removing Cu oxide from the Cu fill metal layer, polishing the Cu fill metal layer such that an upper surface of the insulation layer is exposed, thereby forming the Cu wiring.

11. The method as claimed in claim 10, wherein the cleaning chemical for etching the Cu oxide includes a hydrogen fluoride (HF) aqueous solution.

12. The method as claimed in claim 10, wherein step iii) includes the substeps of depositing a Cu seed layer on the barrier metal layer that coats the barrier metal layer at the side walls and the lower surface of the trench, and electroplating the Cu fill metal layer by using the Cu seed layer as an electrode.

13. The method as claimed in claim 10, wherein the Cu fill metal layer is annealed at a temperature between about 200 and 300° C.

14. The method as claimed in claim 10, wherein the barrier metal layer is selected from the group consisting of a tantalum layer, a tantalum nitride layer, and a composite layer including the tantalum layer on which the tantalum nitride layer is deposited.

15. The method as claimed in claim 10 wherein polishing the Cu fill metal layer comprises polishing by chemical mechanical polishing (CMP).

16. A wafer polishing method comprising the steps of:
   forming a Cu fill metal layer that fills a via hole of an underlying layer of a wafer;
   following forming the Cu fill metal layer, removing Cu oxide from an upper surface of the Cu fill metal layer, created by surface oxidation of the Cu fill metal layer, wherein the Cu oxide is removed through a dry etching process using plasma; and
   polishing the Cu fill metal layer, from which the Cu oxide has been removed.

17. The wafer polishing claimed in claim 16, wherein the dry etching process using plasma includes an RF plasma.

18. The wafer polishing method as claimed in claim 16, wherein the dry etching process is a remote plasma type etching process that uses an excited etching gas.

19. The wafer polishing method as claimed in claim 16 wherein polishing the Cu fill metal layer comprises polishing by chemical mechanical polishing (CMP).

20. The method as claimed in claimed 16 wherein polishing the Cu fill metal layer comprises polishing by chemical mechanical polishing (CMP).

21. A method for forming Cu wiring in a semiconductor device, the method comprising the steps of:
   i) forming a trench on a predetermined portion of an insulation layer;
   ii) forming a barrier metal layer at a sidewall and a lower surface of the trench and the insulation layer;
   iii) forming a Cu fill metal layer such that the trench having the barrier metal layer is buried by the Cu metal layer;
   iv) annealing the Cu fill metal layer thereby crystallizing the Cu fill metal layer;
   v) following forming and annealing the Cu fill metal layer, removing Cu oxide that forms as a result of surface oxidation of the Cu fill metal layer when the Cu fill metal layer is crystallized, wherein the Cu oxide is removed by performing a dry etching process using RF plasma; and
   vi) following removing Cu oxide from the Cu fill metal layer, polishing the Cu fill metal layer such that an upper surface of the insulation layer is exposed, thereby forming the Cu wiring.

* * * * *